United States Patent
Ichihoshi et al.

(10) Patent No.: US 10,615,093 B2
(45) Date of Patent: Apr. 7, 2020

(54) SEMICONDUCTOR DEVICE

(71) Applicant: Mitsubishi Electric Corporation, Chiyoda-ku (JP)

(72) Inventors: Dai Ichihoshi, Tokyo (JP); Norihiko Okumura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 60 days.

(21) Appl. No.: 16/074,013

(22) PCT Filed: Apr. 21, 2017

(86) PCT No.: PCT/JP2017/016015
§ 371 (c)(1),
(2) Date: Jul. 30, 2018

(87) PCT Pub. No.: WO2018/193614
PCT Pub. Date: Oct. 25, 2018

(65) Prior Publication Data
US 2019/0393115 A1 Dec. 26, 2019

(51) Int. Cl.
*H01L 23/31* (2006.01)
*H05K 1/11* (2006.01)
(Continued)

(52) U.S. Cl.
CPC .... *H01L 23/3142* (2013.01); *H01L 23/49827* (2013.01); *H01L 23/49894* (2013.01); *H05K 1/115* (2013.01); *H05K 1/18* (2013.01)

(58) Field of Classification Search
None
See application file for complete search history.

(56) References Cited

U.S. PATENT DOCUMENTS 5,264,730 A    11/1993   Matsuzaki et al.
2011/0207266 A1*   8/2011   Lee ...................... H01L 21/486
                                                                   438/126
(Continued)

FOREIGN PATENT DOCUMENTS

JP    3-205857 A    9/1991
JP    6-224325 A    8/1994
(Continued)

OTHER PUBLICATIONS

Combined Office Action and Search Report dated Mar. 15, 2019 in Taiwanese Patent Application No. 107110699 (with unedited computer generated English translations), 11 pages.
(Continued)

*Primary Examiner* — Alexander G Ghyka
(74) *Attorney, Agent, or Firm* — Oblon, McClelland, Maier & Neustadt, L.L.P.

(57) ABSTRACT

A semiconductor device includes a printed circuit board, a power element, and a sealing resin encapsulating therein the printed circuit board and the power element. The printed circuit board has a plurality of through holes formed therethrough, the through holes being located along an outer periphery at intervals each being equal to or less than four times as great as a circuit-board thickness. Components, which are electrical components such as a resistor, a capacitor, an integrated circuit, and a photocoupler, are mounted on the primed circuit board. The power element, which is a power semiconductor element, is electrically connected to the printed circuit board. The through holes are filled with the sealing resin.

10 Claims, 3 Drawing Sheets

(51) Int. Cl.
  *H05K 1/18*   (2006.01)
  *H01L 23/498*   (2006.01)

(56) References Cited

U.S. PATENT DOCUMENTS

2016/0233146 A1\* 8/2016 Nakamura .............. H01L 24/01
2017/0018524 A1\* 1/2017 Nashida ................. H01L 23/42
2019/0150295 A1\* 5/2019 Gavagnin ............. H05K 1/186
                                                        361/760

FOREIGN PATENT DOCUMENTS

| JP | 2012-255147 A | 12/2012 |
| JP | 2012-256803 A | 12/2012 |
| TW | 201250950 A1 | 12/2012 |

OTHER PUBLICATIONS

International Search Report dated May 30, 2017, in PCT/JP2017/016015 filed Apr. 21, 2017 (with English Translation of Category of Cited Documents).

\* cited by examiner

SEMICONDUCTOR DEVICE

FIELD

The present invention relates to a semiconductor device having semiconductor elements and a printed circuit board encapsulated in a molded resin material.

BACKGROUND

For a semiconductor device having semiconductor elements and a printed circuit board encapsulated in a molded resin material, it is known that thermal contraction after the resin encapsulation or a thermal stress in cold environments produces a stress on the interface between the printed circuit board and the sealing resin material, thereby causing an interfacial delamination. The spread of the interfacial delamination to a location where components are mounted on the printed circuit board can pose problems such as a crack appearing at a soldered joint portion, a component delamination, and a break in a wire.

Patent Literature 1 discloses that a through hole is provided at each of four corners of a printed circuit board, and an interfacial delamination between the printed circuit board and the sealing resin material is suppressed by an anchor effect of a resin filling the through holes.

CITATION LIST

Patent Literature

Patent Literature 1: Japanese Patent Application Laid-open No. 2012-256803

SUMMARY

Technical Problem

However, the invention disclosed in Patent Literature 1 cannot suppress the interfacial delamination that occurs at a central portion of each side of the printed circuit board where the through hole Is not provided. Unfortunately, the interfacial delamination thus spreads to the inside of the circuit.

The present invention has been achieved to solve the above problems, and an object of the present invention is to provide a semiconductor device that suppresses occurrence and spread of the Interfacial delamination between the printed circuit board and the sealing resin material at the central portion of each side of the printed circuit board.

Solution to Problem

In order to solve the above problems and achieve the object, the present invention includes: a printed circuit board having a plurality of through holes formed therethrough, the through holes being located along an outer periphery of the printed circuit board at intervals each being equal to or less than four times as great as a circuit-board thickness; and a semiconductor element electrically connected to the printed circuit board. The present invention further includes a sealing resin encapsulating therein the printed circuit board and the semiconductor element, and the through holes are filled with the sealing resin.

Advantageous Effects of Invention

The semiconductor device according to the present Invention has an effect of suppressing the occurrence and spared of the interfacial delamination between the printed circuit board and the sealing resin at the central portion of each side of the printed circuit board.

DESCRIPTION OF EMBODIMENTS

A semiconductor device according to embodiments of the present invention will be described in detail below with reference to the accompanying drawings. The present invention is not limited to the embodiments.

First Embodiment

Figure 1:
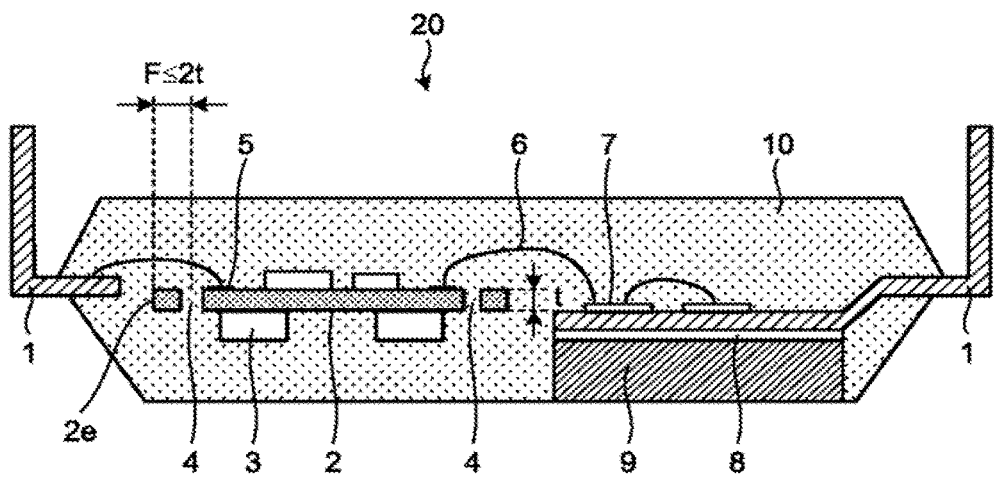
FIG. 1 is a schematic cross-sectional diagram of a semiconductor device according to a first embodiment of the present invention.
Figure 2:
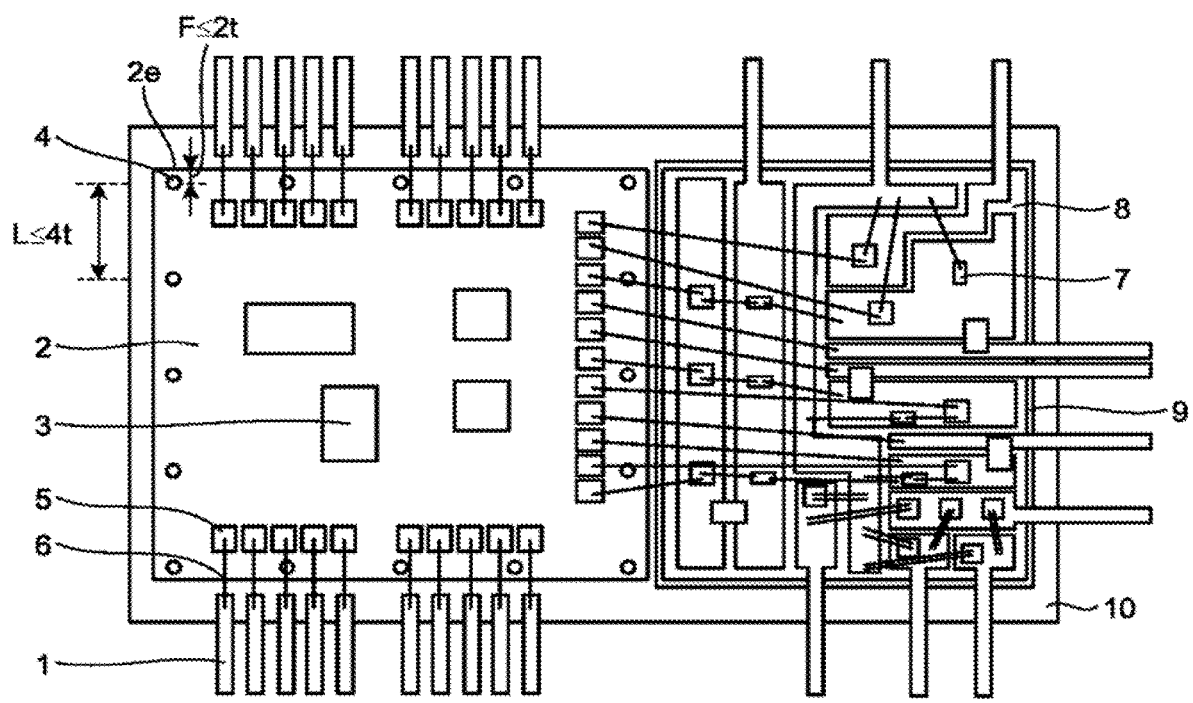
FIG. 2 is a top view of the semiconductor device according to the first embodiment.

FIG. 1 is a schematic cross-sectional diagram of a semiconductor device according to a first embodiment of the present invention. FIG. 2 is a top view of the semiconductor device according to the first embodiment. In a semiconductor device 20, a printed circuit board 2 and power elements 7 are encapsulated in a molded sealing resin 10. Components 3, which are electric components such as a resistor, a capacitor, an integrated circuit (IC), and a photocoupler, are mounted on the printed circuit board 2. The power elements 7 are power semiconductor elements. Examples of the power element 7 include, but not limited to, an insulated gate bipolar transistor and a diode. The power elements 7 are mounted on the surface of a lead frame 1, and are connected to a bonding pad 5 of the printed circuit board 2 through a metal wire 6. A metal base 9 is located on the back surface of the lead frame 1 with an insulating sheet 8 interposed therebetween. The back surface of the lead frame 1 is the opposite surface to the surface on which the power elements 7 are mounted. The metal base 9 is exposed to the outside from the sealing resin 10. Heat generated by the power elements 7 is dissipated out of the semiconductor device 20 through the Insulating sheet 8 and the metal base 9.

A plurality of through holes 4 are formed through the printed circuit board 2 along an outer periphery 2e of the board 2 at intervals L, each of the intervals being equal to or less than four times as great as a circuit-board thickness t. That is, the through holes 4 are formed through the outer peripheral portion of the printed circuit board 2 at the intervals L each being equal to or less than four times as great as the circuit-board thickness t. The interval L between the through holes 4 is a distance between the centers of the adjacent through holes 4. Each of the through holes 4 is located a distance F away from the outer periphery 2e of the printed circuit board 2, the distance F being equal to or less than twice as great as the circuit-board thickness t. The components 3 placed on the printed circuit board 2, and a wiring pattern on the surface or the inside of the printed circuit board 2 are located within an area surrounded by the through holes 4. The components 3 are located within an area where the wiring pattern is formed because the wiring pattern is formed for electrical connection of the components 3 that are electrical components. The through holes 4 are filled with the sealing resin 10. The anchor effect of the sealing resin 10 filling the through holes 4 suppresses an interfacial delamination between the printed circuit board 2 and the sealing resin 10.

Figure 3:
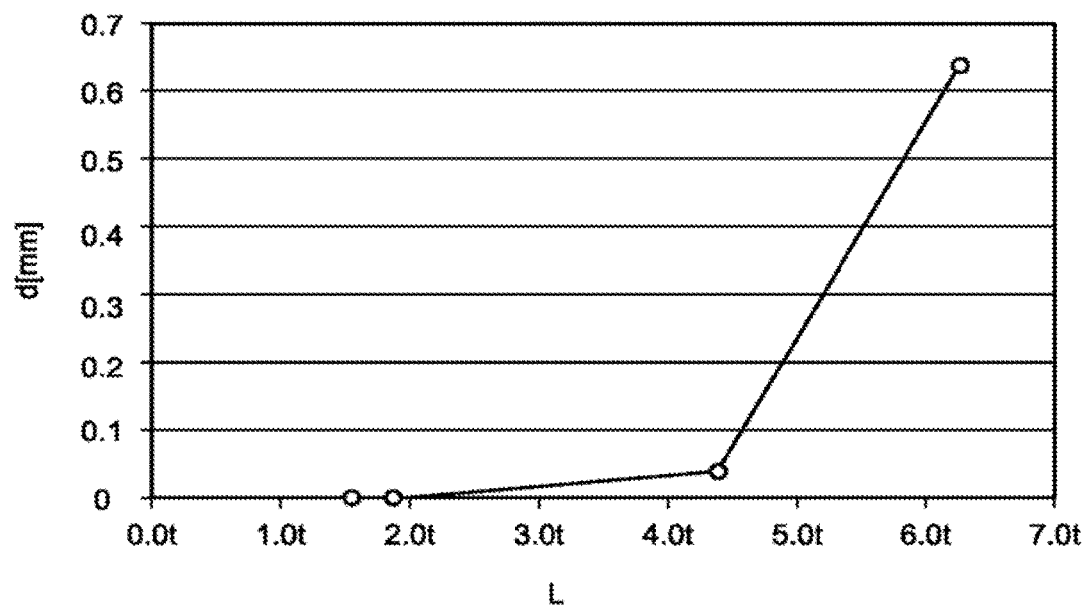
FIG. 3 is a diagram illustrating a relation between a delamination length of an interfacial delamination and an interval between through holes formed through a printed circuit board of the semiconductor device according to the first embodiment.

FIG. 3 is a diagram illustrating a relation between a delamination length d of an interfacial delamination and the interval L between the through holes formed through the printed circuit board of the semiconductor device according to the first embodiment. The interfacial delamination in FIG. 3 is generated between the printed circuit board 2 and the sealing resin 10 due to a thermal stress caused by heating and cooling the semiconductor device 20.

Figure 4:
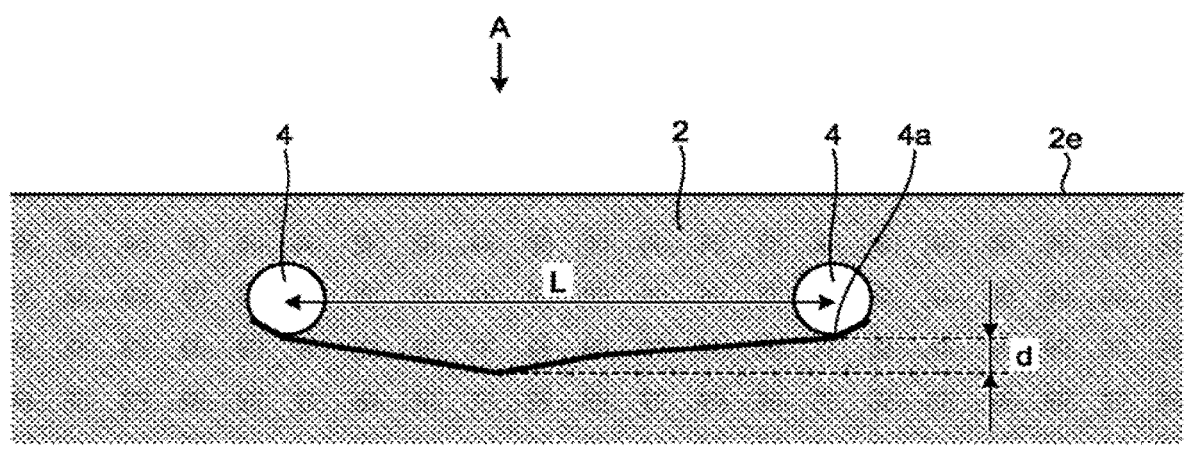
FIG. 4 is a top view illustrating definition of the delamination length of the interfacial delamination between a sealing resin and the printed circuit board of the semiconductor device according to the first embodiment.

FIG. 4 is a top view illustrating definition of the delamination length of the interfacial delamination between the sealing resin and the printed circuit board of the semiconductor device according to the first embodiment. As illustrated in FIG. 4, the delamination length d of the interfacial delamination refers to a distance between an edge 4a located on the opposite side to the outer periphery 2e of the printed circuit board 2 in the through hole 4, and a position to which the interfacial delamination has spread the furthest in a direction perpendicular to the direction of arrangement of the through holes 4 and away from the outer periphery 2e of the printed circuit board 2, that is, in the direction from the through holes 4 toward the center of the printed circuit board 2. That is, the delamination length d is a distance by which the interfacial delamination spreads from the through holes 4 as a starting point toward the center of the printed circuit board 2. In FIG. 4, the direction, which is perpendicular to the direction of the arrangement of the through holes 4 and is away from the outer periphery 2e of the printed circuit board 2, is illustrated by an arrow A.

As illustrated in FIG. 3, when the interval L between the through holes 4 is equal to or less than four times as great as the circuit-board thickness t of the printed circuit board 2, then the delamination length of the interfacial delamination is 0.1 mm or less. Thus, even when the interfacial delamination occurs, spread of the interfacial delamination is suppressed as the interval L is equal to or less than four times the circuit-board thickness t of the printed circuit board 2.

As the power elements 7 generate heat during driving the semiconductor device 20, the temperature of the semiconductor device 20 increases. Possible causes of the temperature change of the semiconductor device 20 include the temperature to mold-cure the sealing resin 10 during the manufacturing process.

The interfacial delamination between the printed circuit board 2 and the sealing resin 10 occurs due to a stress caused by a difference in the linear expansion coefficient between the sealing resin 10 and the base material of the printed circuit board 2. The stress caused by the difference in the linear expansion coefficient is relatively high on the outer periphery 2e of the printed circuit board 2. Thus, the through holes 4 are located in an area away from the outer periphery 2e of the printed circuit board 2 by a distance equal to or less than twice as long as the circuit-board thickness t, and the components 3 are located inside the region surrounded by the through holes 4. The through holes 4 located close to the outer periphery 2e of the printed circuit board 2 can suppress an interfacial delamination that may occurs on the outer periphery 2e of the printed circuit board 2. Furthermore, even when an interfacial delamination occurs, the through holes 4 can stop the interfacial delamination near the outer periphery 2e of the printed circuit board 2 from spreading any further.

The components 3 may interfere with injection of the sealing resin 10. Therefore, in order to reliably fill the through holes 4 with the sealing resin 10, it is desirable that the components 3 are not located atop the through holes 4 or between the through holes 4 and a resin injection port of a die used for molding the sealing resin 10.

an epoxy-based molding resin, which serves as the sealing resin 10 to encapsulate the power elements 7 and the printed circuit board 2, can be selected. The sealing resin 10 contains an inorganic filler such as a silica filler or an alumina filler. The average particle diameter of the filler is generally several micrometers to several tens of micrometers. In order to reliably fill the through holes 4 with the sealing resin 10, it is desirable for the through holes 4 to have an opening diameter that is equal to or more 10 times as large as the average particle diameter of the filler.

Linear expansion, which is one of the causes of a stress between the printed circuit board 2 and the sealing resin 10, is affected by the glass transition temperature. Thus, a difference in the glass transition temperature between the sealing resin 10 and the base material of the printed circuit board 2 is set to 30 degrees or less so as to decrease the stress and hence suppress the interfacial delamination.

As described above, the semiconductor device 20 according to the first embodiment suppresses the occurrence and the spread of the interfacial delamination between the printed circuit board 2 and the sealing resin 10, and thus can improve the reliability.

Although, in the first embodiment, the through holes 4 are formed along the entire outer periphery of the printed circuit board 2, the through holes 4 need not be formed along the entire outer periphery as long as the through holes 4 are formed at least at a location where the delamination is more likely to occur.

Second Embodiment

Figure 5:
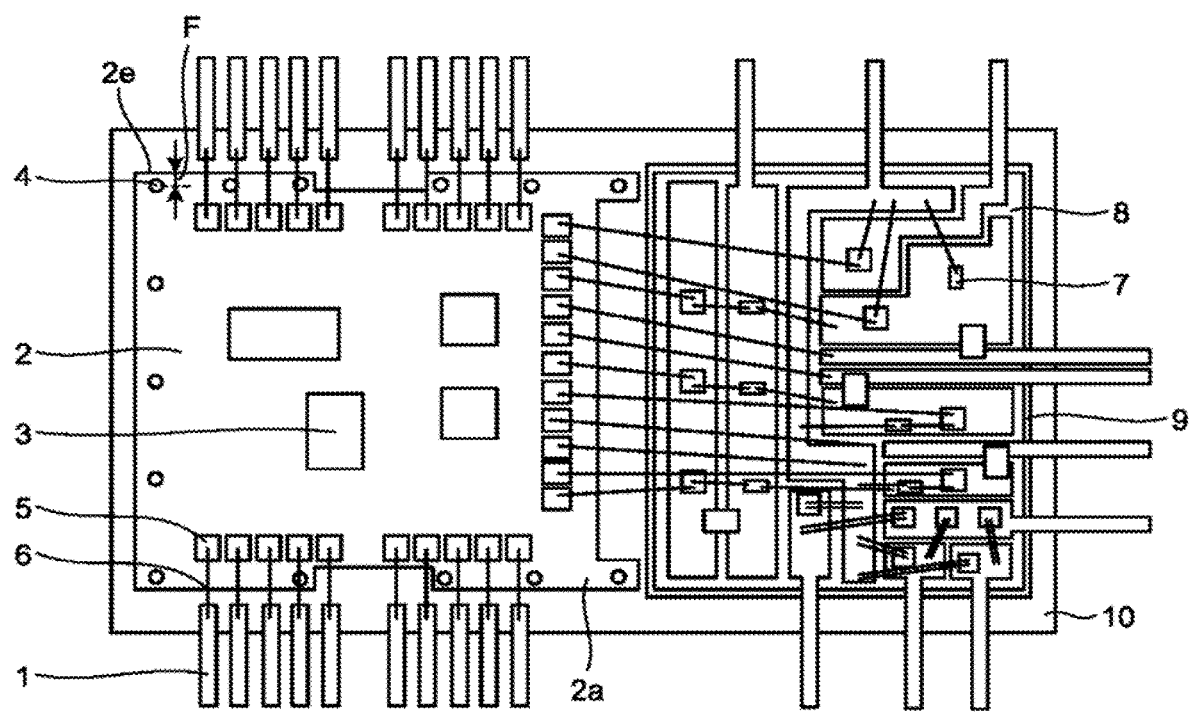
FIG. 5 is a top view of a semiconductor device according to a second embodiment of the present invention.

FIG. 5 is a top view of a semiconductor device according to a second embodiment of the present invention. The semiconductor device 20 according to the second embodiment is different from the semiconductor device 20 according to the first embodiment in that the printed circuit board 2 does not have a rectangular shape but is contoured to have protruding portions 2a protruding in the in-plane direction. In the second embodiment, the through hole 4 is formed through the protruding portions 2a. Other features of the second embodiment are identical to those of the first embodiment.

For the printed circuit board 2 having the contour having the protruding portions 2a, an interfacial delamination between the printed circuit board 2 and the sealing resin 10 occurs at the protruding portions 2a where a stress is more likely to be concentrated. Therefore, it is desirable that the through hole 4 be formed through the protruding portions 2a and located the shortest possible distance F away from the outer periphery 2e of the printed circuit board 2.

The semiconductor device 20 according to the second embodiment suppresses the occurrence and spread of the interfacial delamination between the sealing resin 10 and the printed circuit board 2 having the contour having the protruding portions 2a, and thus can improve the reliability.

In the first and second embodiments, the description is made as to the structure encapsulating the power elements 7, which are the power semiconductor elements, together with the printed circuit board 2 in the sealing resin 10. An element to be encapsulated together with the printed circuit board 2 in the sealing resin 10 is not limited to the power semiconductor element.

The configurations described in the above embodiments are only examples of the content of the present invention. The configurations can be combined with other well-known techniques, and a part of each configuration car be omitted or modified without departing from the scope of the present invention.

REFERENCE SIGNS LIST 1 lead frame, 2 printed circuit board, 2a protruding portion, 2e outer periphery, 3 component, 4 through hole, 4a edge, 5 bonding pad, 6 metal wire, 7 power element, 8 insulating sheet, 9 metal base, 10 sealing resin, 20 semiconductor device.

The invention claimed is:

1. A semiconductor device comprising:
a printed circuit board having a plurality of through holes formed therethrough, the through holes being located along an outer periphery of the printed circuit board at intervals each being equal to or less than four times as great as a circuit-board thickness;
a semiconductor element electrically connected to the printed circuit board; and
a sealing resin encapsulating therein the printed circuit board and the semiconductor element, wherein
the printed circuit board has a contour having a protruding portion at the outer periphery, the through holes being formed through the protruding portion, and
the through holes are filled with the sealing resin.

2. The semiconductor device according to claim 1, wherein each of the through holes is located a distance away from the outer periphery of the printed circuit board, the distance being equal to or less than twice as great as the circuit-board thickness.

3. The semiconductor device according to claim 1, wherein the printed circuit board has a wiring pattern formed only within an area of the printed circuit board, the area being surrounded by the through holes.

4. The semiconductor device according to claim 1, wherein a difference in glass transition temperature between the sealing resin and a base material of the printed circuit board is 30° C. or less.

5. The semiconductor device according to claim 2, wherein a difference in glass transition temperature between the sealing resin and a base material of the printed circuit board is 30° C. or less.

6. The semiconductor device according to claim 1, wherein
the sealing resin contains a filler of inorganic-material particles, and
the through hole has an opening diameter that is equal to or more 10 times as large as an average particle diameter of the filler.

7. The semiconductor device according to claim 2, wherein
the sealing resin contains a filler of inorganic-material particles, and
the through hole has an opening diameter that is equal to or more 10 times as large as an average particle diameter of the filler.

8. The semiconductor device according to claim 3, wherein
the sealing resin contains a filler of inorganic-material particles, and
the through hole has an opening diameter that is equal to or more 10 times as large as an average particle diameter of the filler.

9. The semiconductor device according to claim 4, wherein
the sealing resin contains a filler of inorganic-material particles, and
the through hole has an opening diameter that is equal to or more 10 times as large as an average particle diameter of the filler.

10. The semiconductor device according to claim 5, wherein
the sealing resin contains a filler of inorganic-material particles, and
the through hole has an opening diameter that is equal to or more 10 times as large as an average particle diameter of the filler.

* * * * *